United States Patent
Lorenz et al.

(10) Patent No.: US 8,837,635 B2
(45) Date of Patent: Sep. 16, 2014

(54) CONTROLLING A TRANSMIT PATH BASED ON MONITORED ERROR VECTOR MAGNITUDE (EVM) PERFORMANCE

(75) Inventors: Robert Lorenz, Menlo Park, CA (US); Djordje Tujkovic, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 22 days.

(21) Appl. No.: 13/491,167

(22) Filed: Jun. 7, 2012

(65) Prior Publication Data

US 2012/0314746 A1    Dec. 13, 2012

Related U.S. Application Data

(60) Provisional application No. 61/494,844, filed on Jun. 8, 2011, provisional application No. 61/611,728, filed on Mar. 16, 2012.

(51) Int. Cl.
| | |
|---|---|
| *H04L 25/49* | (2006.01) |
| *H03F 1/32* | (2006.01) |
| *H03F 3/24* | (2006.01) |
| *H03G 3/30* | (2006.01) |
| *H03F 1/02* | (2006.01) |
| *H03F 3/195* | (2006.01) |

(52) U.S. Cl.
CPC ........... *H03G 3/3042* (2013.01); *H03F 1/3247* (2013.01); *H03F 1/3294* (2013.01); *H03F 3/245* (2013.01); *H03F 2200/504* (2013.01); *H03F 2200/102* (2013.01); *H03F 2200/405* (2013.01); *H03F 2200/336* (2013.01); *H03F 1/0216* (2013.01); *H03F 3/195* (2013.01); *H03F 1/0261* (2013.01)
USPC ........ 375/297; 375/295; 375/296; 455/114.2; 455/114.3; 455/115.1; 455/115.3; 455/120; 455/123; 455/125; 455/126; 455/127.1; 455/127.2

(58) Field of Classification Search
USPC ............ 375/295, 296, 297; 455/114.2, 114.3, 455/115.1, 115.3, 120, 123, 125, 126, 455/127.1, 127.2
See application file for complete search history.

(56) References Cited

U.S. PATENT DOCUMENTS

| | | | | |
|---|---|---|---|---|
| 6,917,389 B2 * | 7/2005 | Lee | ................................ | 348/608 |
| 7,688,136 B2 * | 3/2010 | Langer et al. | .................. | 330/129 |
| 7,755,429 B2 * | 7/2010 | Nguyen et al. | ................ | 330/289 |
| 7,792,181 B2 * | 9/2010 | Yamanouchi et al. | ........ | 375/224 |

(Continued)

OTHER PUBLICATIONS

International Search Report directed toward related International Application No. PCT/US2012/041559, mailed Sep. 14, 2012 from the ISA/US, Alexandria, VA; 2 pages.

(Continued)

*Primary Examiner* — Siu Lee
(74) *Attorney, Agent, or Firm* — Sterne, Kessler, Goldstein & Fox P.L.L.C.

(57) ABSTRACT

Embodiments provide systems and methods to dynamically control a radio frequency (RF) transmitter based on monitored error vector magnitude (EVM) performance. Embodiments are enabled by a feedback path that allows estimating the EVM at the output of the transmitter and controlling the transmitter, including the power amplifier (PA), accordingly. As such, the transmitter (and the PA) can be operated as close as possible to the ideal operating point that meets, based on actual conditions, a specified EVM performance and desired output power. By doing so, the overall power consumption of the transmitter is reduced.

23 Claims, 5 Drawing Sheets

(56) References Cited

U.S. PATENT DOCUMENTS

| | | | |
|---|---|---|---|
| 8,026,762 B2* | 9/2011 | Honcharenko | 330/124 R |
| 8,116,363 B2* | 2/2012 | Shafeeu | 375/227 |
| 8,126,036 B2* | 2/2012 | Koren et al. | 375/219 |
| 8,265,572 B2* | 9/2012 | Kenington | 455/101 |
| 8,432,225 B2* | 4/2013 | Young et al. | 330/285 |
| 8,565,343 B1* | 10/2013 | Husted et al. | 375/297 |
| 2004/0137856 A1 | 7/2004 | Kanazawa et al. | |
| 2005/0130610 A1* | 6/2005 | Scheck et al. | 455/126 |
| 2008/0032634 A1 | 2/2008 | Magoon et al. | |
| 2009/0117865 A1* | 5/2009 | Vinayak et al. | 455/127.1 |
| 2009/0285330 A1 | 11/2009 | Premakanthan et al. | |

OTHER PUBLICATIONS

Written Opinion directed toward related International Application No. PCT/US2012/041559, mailed Sep. 14, 2012 from the ISA/US, Alexandria, VA; 4 pages.

International Preliminary Report on Patentability directed toward related International Application No. PCT/US2012/041559, issued Dec. 10, 2013 from The International Bureau of WIPO, Geneva, Switzerland; 6 pages.

International Search Report and Written Opinion for PCT Application No. PCT/US2012/041559, dated Sep. 14, 2012, 12 pages.

* cited by examiner

CONTROLLING A TRANSMIT PATH BASED ON MONITORED ERROR VECTOR MAGNITUDE (EVM) PERFORMANCE

CROSS-REFERENCE TO RELATED APPLICATIONS

The present invention claims the benefit of U.S. Provisional Application No. 61/494,844, filed Jun. 8, 2011, and U.S. Provisional Application No. 61/611,728, filed Mar. 16, 2012, both of which are incorporated herein by reference in their entireties.

BACKGROUND

1. Field of the Invention

The present invention relates generally to radio frequency (RF) transceivers.

2. Background Art

Air interface specifications require radio frequency (RF) transmitters to meet a specified error vector magnitude (EVM) performance measured at the antenna of the transmitter. The EVM represents a measure of noise and distortion in a transmitted waveform and is a figure of merit of the transmitter modulation.

Typically, distortion introduced by the power amplifier (PA) of the transmitter is the largest contributor to the EVM measured at the antenna of the transmitter. As such, conventionally, to meet the specified EVM performance, the PA is designed to maintain its output power close to its rated output power over all conditions (i.e., temperature, process, and load impedance variations). This is done by fully characterizing the PA over all conditions (at testing time) and by configuring the PA to operate within a fixed margin from the specified EVM performance so as to accommodate all operating conditions.

While this conventional approach works to maintain EVM compliance by the transmitter, the fixed margin typically increases the power dissipation of the PA beyond what is needed to generate the desired output power under nominal conditions. In addition, the full characterization of the PA at testing time is both costly and time consuming.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Air interface specifications (e.g., WiMAX RCT, 3GPP TS 36.101, etc.) define the error vector magnitude (EVM) as the difference between an ideal reference waveform and a measured waveform. When measured at the output of a radio frequency (RF) transmitter, the EVM represents a measure of noise and distortion in a transmitted waveform and is a figure of merit of the transmitter modulation.

Figure 1:
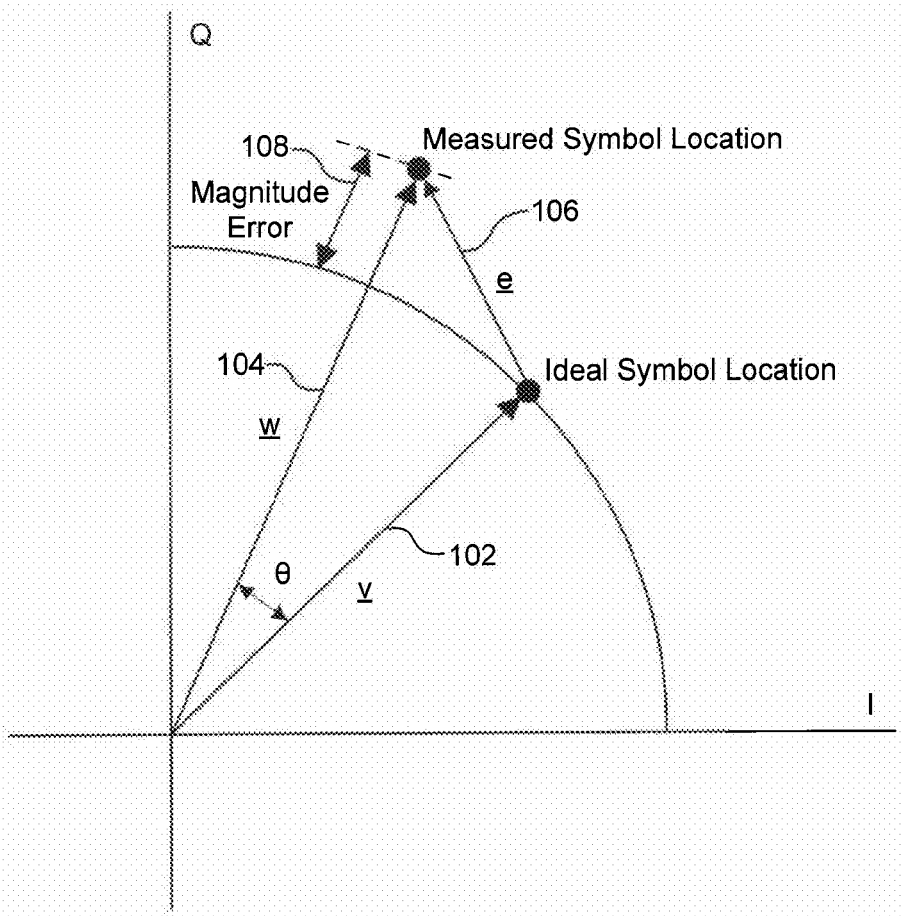
FIG. 1 is an example that illustrates the error vector magnitude (EVM) of a transmitted symbol.

FIG. 1 is an example 100 that illustrates the EVM of an example transmitted symbol. As shown in FIG. 1, ideally, if the transmitter, receiver, and communication channel were all ideal (i.e., no distortion or noise is introduced), the transmitted symbol would be represented, in the complex I/Q domain, by the ideal vector $\underline{v}$ 102. However, because of noise and distortion, which may be introduced by the transmitter, receiver, and/or the communication channel, the actual symbol as measured by the receiver is represented by the vector $\underline{w}$ 104. The error vector $\underline{e}$ 106 represents the difference between the actual measured symbol $\underline{w}$ 104 and the ideal vector $\underline{v}$ 102. As shown in FIG. 1, the error vector $\underline{e}$ 106 defines a phase error $\theta$ and a magnitude error 108 between the actual measured symbol $\underline{w}$ 104 and the ideal vector $\underline{v}$ 102.

The EVM is defined, in dB, as the ratio of the root mean square (RMS) power of the error vector $\underline{e}$ 106 to the RMS power of the ideal vector $\underline{v}$ 102, over a window of N demodulated symbols.

Air interface specifications require RF transmitters to meet a specified EVM performance measured at the antenna of the transmitter. For example, WiMAX specifies a −24 dB EVM. Typically, distortion introduced by the power amplifier (PA) is the largest contributor to the EVM measured at the antenna of the transmitter. As such, conventionally, the PA is designed so as to maintain its output power close to its rated output power over all conditions (i.e., temperature, process, and load impedance variations). This is done by fully characterizing the PA over all conditions and by configuring the PA to operate within a fixed margin from the specified EVM performance so as to accommodate all operating conditions.

While this conventional approach works to maintain EVM compliance by the transmitter, the fixed margin typically increases the power dissipation of the PA beyond what is needed to generate the desired output power under nominal conditions.

Embodiments of the present invention, as further described below, provide systems and methods to dynamically control a RF transmitter based on monitored EVM performance. Embodiments are enabled by a feedback path that allows estimating the EVM at the output of the transmitter and controlling the transmitter, including the PA, accordingly. As such, the transmitter (and the PA) can be operated as close as possible to the ideal operating point that meets, based on actual conditions, the specified EVM performance and desired output power. By doing so, the overall power consumption of the transmitter is reduced.

In the following, example embodiments will be provided. These example embodiments are provided for the purpose of illustration and are not limiting. Embodiments will be described with reference to an example transmitter having a particular architecture. Specifically, the example transmitter uses a receiver feedback path and an envelope tracking PA supply voltage (i.e., the PA supply voltage tracks the complex envelope of the output waveform being generated). However, embodiments are not limited to this example transmitter, and can be extended to other transmitter architectures as would be understood by a person of skill in the art based on the teachings herein.

Figure 2:
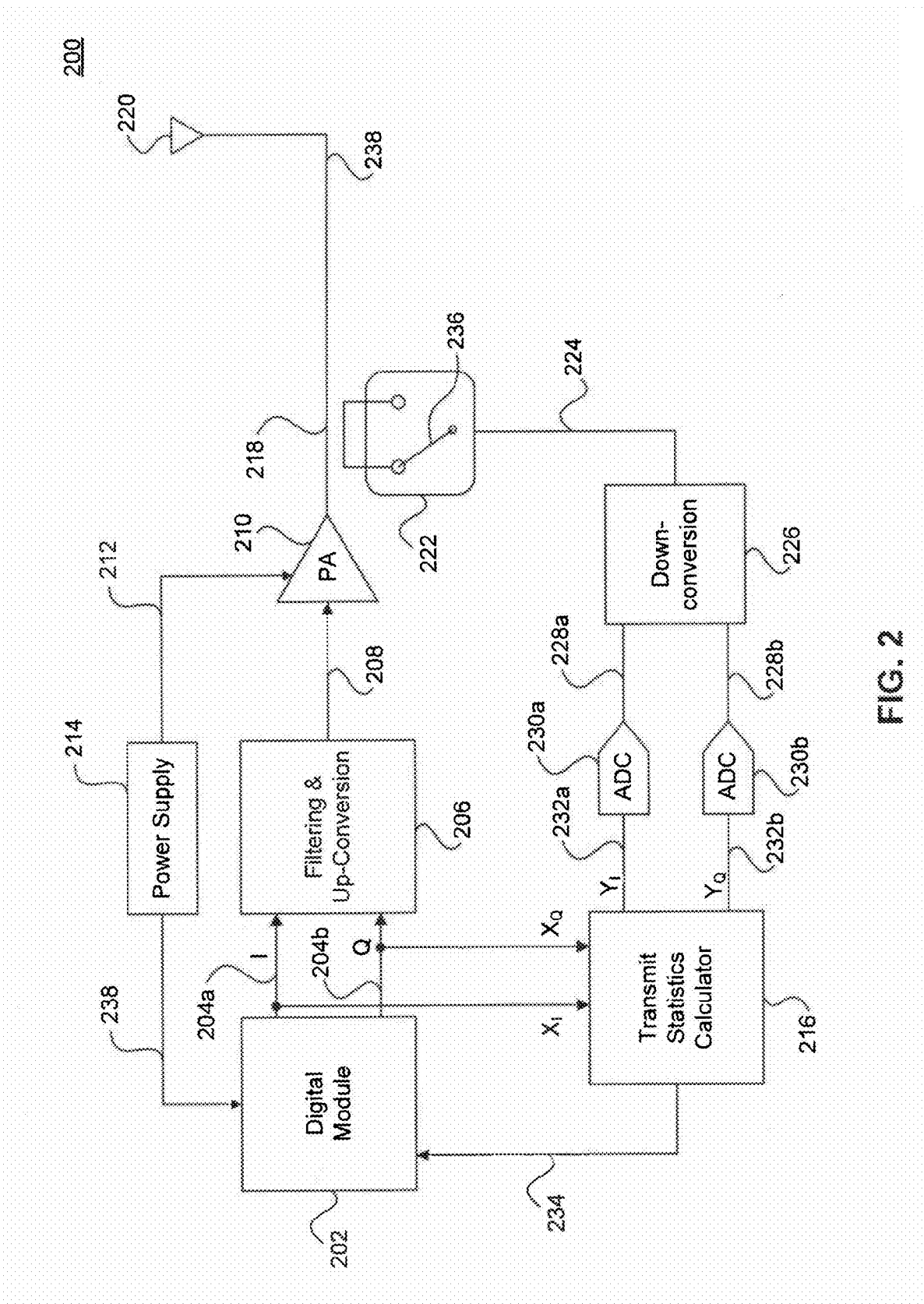
FIG. 2 illustrates an example RF transmitter according to an embodiment of the present invention.

FIG. 2 illustrates an example RF transmitter 200 according to an embodiment of the present invention. Example transmitter 200 can be used to perform embodiments of the present invention.

As shown in FIG. 2, example transmitter 200 includes a digital module 202, a filtering and up-conversion module 206, a power amplifier (PA) 210, a power supply 214, an antenna 220, a directional coupler 222, a down-conversion module 226, Analog-to-Digital Converters (ADCs) 230*a* and 230*b*, and a transmit (TX) statistics calculator module 216. As would be understood by a person of skill in the art based on the teachings herein, transmitter 200 may include more components than shown in FIG. 2, which are omitted herein for the purpose of simplification. Transmitter 200 may also be integrated with a receiver that also uses antenna 220.

Digital module 202 generates in-phase (I) and quadrature-phase (Q) signals 204*a* and 204*b* based on an input signal to be transmitted. I and Q signals 204*a* and 204*b* may be digital or analog. When I and Q signals 204*a* and 204*b* are digital, digital-to-analog converters (DACs) (not shown in FIG. 2) are used to convert signals 204*a* and 204*b* to analog form, before providing them to filtering and up-conversion module 206. In an embodiment, digital module 202 may pre-distort I and Q signals 204*a* and 204*b* to compensate for non-linearities in module 206 and PA 110. In embodiments, digital module 202 may be implemented using hardware and/or software components.

Filtering and up-conversion module 206 performs filtering (e.g., interpolation filtering) and frequency up-conversion on I and Q signals 204*a* and 204*b*, and then sums the resulting signals to generate RF signal 208.

PA 210 receives RF signal 208 from filtering and up-conversion module 206, and power amplifies RF signal 208 to generate an output signal 218 for transmission by antenna 220. To ensure maximum power transfer from PA 210 to antenna 220, PA 210 is designed to operate at its maximum efficiency based on a known nominal impedance (e.g., 50 Ohms) presented by antenna 220. For example, PA 210 may use back termination circuitry that is impedance-matched to the antenna impedance.

In addition, PA 210 receives a supply voltage 212 from power supply 214. In an embodiment, power supply 214 adjusts supply voltage 212 of PA 210 according to the envelope information of output signal 218, thus varying the operating point of PA 210 according to the desired instantaneous output power level. In an embodiment, PA 210 includes a field-effect transistor (FET), and supply voltage 212 is applied to a drain terminal of the FET. In an embodiment, PA 210 include a hetero junction bipolar transistor and supply voltage 212 is applied to the collector terminal of the transistor.

In other embodiments, PA 510 includes inputs to adjust the bias setting and the gain setting. In other embodiments, PA 510 may be a multi-stage PA, and each of the multiple stage of PA may be controlled in similar fashion as described above (e.g., by adjusting the supply voltage, bias setting, gain setting, etc.)

Power supply 214 may be an envelope tracking power supply or a switching mode power supply (SMPS). In an embodiment, power supply 214 receives a control signal 238 from digital module 202, and controls supply voltage 212 accordingly. In an embodiment, control signal 238 is produced by determining the modulus of I and Q signals 204*a* and 204*b* and then applying it to a look up table (after optionally interpolating the modulus) to determine control signal 238. In an embodiment, where power supply 214 is an envelope tracking power supply, control signal 238 includes an instantaneous voltage. In another embodiment, where power supply 214 is a SMPS, control signal 238 may be a semi-static voltage or control information (provided through a digital interface (e.g., MIPE, RFFE, etc.) for example) that sets power supply 214 to a fixed voltage.

According to embodiments, as further described below, PA 210 is controlled dynamically by digital module 202, based on estimated EVM performance of RF transmitter 200, measured at the output of PA 210. Specifically, digital module 202 may increase/decrease supply voltage 212 of PA 210 based on a comparison of an estimated EVM and a desired EVM.

In embodiments, control of PA 210 based on the estimated EVM is enabled by a feedback path, comprised of directional coupler 222, down-conversion module 226, ADCs 230*a* and 230*b*, and TX statistics calculator module 216. As further described below, the feedback path enables estimating the EVM at the output of PA 210 and controlling the transmit path accordingly.

Directional coupler 222 is coupled to the output of PA 210 so as to receive output signal 218 of PA 210 and generate a RF signal 224. A controllable switch 236 within coupler 222 allows either a forward coupled port or a reverse coupled port of coupler 222 to be sampled. As such, directional coupler 222 can be used to measure either the forward or reflected signal components (both amplitude and phase) present in output signal 218 of PA 210. According to embodiments, directional coupler 222 is controlled so as to measure the forward signal components at the output of PA 210, from which the EVM at the output of PA 210 can be estimated.

RF signal 224 is provided to down-conversion module 226, which frequency down-converts RF signal 224 and generates baseband analog I and Q signals 228*a* and 228*b*. Signals 228*a* and 228*b* are digitized by ADCs 230*a* and 230*b*, respectively, to generate digital baseband feedback I and Q signals 232*a* and 232*b*, which are then provided to TX statistics calculator module 216.

TX statistics calculator module 216 receives feedback I and Q signals 232*a* and 232*b* (which form a digital feedback signal) and corresponding I and Q signals 204*a* and 204*b* (which form a digital input reference signal). In an embodiment, I and Q signals 204*a* and 204*b* are delayed appropriately to ensure timing alignment with feedback I and Q signals 232*a* and 232*b*. TX statistics calculator module 216 correlates feedback I and Q signals 232*a* and 232*b* with I and Q signals 204*a* and 204 to produce cross-correlation products between the digital feedback signal and the digital input reference signal. TX statistics calculator module 216 also calculates auto-correlation products of the digital input reference signal and of the digital feedback signal. These products, which are further described below, are then provided via signal 234 to digital module 202 to estimate the EVM at the output of PA 210.

Using the products computed by TX statistics calculator module 216, digital module 202 estimates a complex gain of a concatenated path consisting of the transmit path (the transmit path is the path from the output of digital module 202 to the output of PA 210) and the feedback path of RF transmitter 200. Then, digital module 202 estimates the EVM at the output of PA 210 based on a difference between the feedback signal and a scaled version of the input signal, where the scaled version of the input signal is scaled by the estimated complex gain of the concatenated path.

Digital module 202 then controls the transmit path of RF transmitter 200 based on the estimated EVM. In an embodiment, digital module 202 controls the transmit path based on a comparison of the estimated EVM to a desired EVM. The desired EVM may be specified by an air interface specification with which the wireless device complies (e.g., WiMAX RCT, 3GPP TS 36.101, etc).

As described above, in an embodiment, digital module 202 controls supply voltage 212 of PA 210 based on the comparison of the estimated EVM to the desired EVM. For example, digital module 202 may increase supply voltage 212 of PA 219 when the estimated. EVM is higher than the desired EVM, and reduce supply voltage 212 of PA 210 when the estimated EVM is lower than the desired EVM by more than a desired margin (the margin is normally intended to account for temperature, process, and load impedance variations).

In an embodiment, digital module 202 may reduce the output power of output signal 218 of PA 210 when the estimated EVM is higher than the desired EVM. Digital module 202 may do so using a variety of control mechanisms, including, for example, where the transmit path includes a PA driver circuit located before the PA, controlling a bias current of the PA driver circuit to reduce the output power. Alternatively, or additionally, digital module 202 may reduce the amplitude of digital input reference signal, namely, I and Q signals 204a and 204b, to reduce the output power.

In other embodiments, in addition to controlling PA supply voltage 212, digital module 202 may control the gain and/or bias setting of PA 210. In the case PA 210 is a multi-stage PA, digital control module 202 may control the supply voltage, gain setting, and/or bias setting of any of the PA stages of the PA.

As described above, in an embodiment, the EVM is estimated by estimating a complex gain of the concatenated transmit path and feedback path, and then estimating the EVM based on a difference between the feedback signal and a scaled version of the input signal, where the scaled version of the input signal is scaled by the estimated complex gain of the concatenated path. One example implementation of this approach is described mathematically below.

This example implementation assumes that the feedback signal (obtained from the feedback path) is related to the input reference signal (output of the digital module) by the linear equation y=a.x+μ+v, where y represents the feedback signal, x represents the input reference signal, α represents the complex gain of the concatenated transmit path and feedback path, μ represents a DC offset term, and u represents a noise and distortion term.

Based on this linear model, a 2×M matrix of measured feedback signal samples can be written as:

$$[y_1 y_2 \ldots y_M] = \alpha[x_1 x_2 \ldots x_M] + \underline{V} + \underline{M} \quad (1)$$

wherein the matrix $[x_1\ x_2\ \ldots\ x_M]$ is a 2×M matrix of transmitted input samples, $\underline{V}$ is a 2×M matrix of noise and distortion terms, and $\underline{M}$ is a 2×M matrix of DC offset terms.

Multiplying both sides of equation (1) by the transpose of the matrix $[x_1\ x_2\ \ldots\ x_M]$, equation (1) becomes:

$$[y_1\ y_2\ \ldots\ y_M]\begin{bmatrix}x_1^T\\x_2^T\\\vdots\\x_M^T\end{bmatrix} = \alpha[x_1\ x_2\ \ldots\ x_M]\begin{bmatrix}x_1^T\\x_2^T\\\vdots\\x_M^T\end{bmatrix} + \underline{V}\begin{bmatrix}x_1^T\\x_2^T\\\vdots\\x_M^T\end{bmatrix} + \underline{M}\begin{bmatrix}x_1^T\\x_2^T\\\vdots\\x_M^T\end{bmatrix} \quad (2)$$

With the DC offset being not correlated with the input signal, equation (2) can be written as shown below, by ignoring the DC offset:

$$R_{yx} = \alpha R_{xx} + \tilde{V} \text{ where} \quad (3)$$

$$R_{yx} = [y_1\ y_2\ \ldots\ y_M]\begin{bmatrix}x_1^T\\x_2^T\\\vdots\\x_M^T\end{bmatrix},$$

$$R_{xx} = [x_1\ x_2\ \ldots\ x_M]\begin{bmatrix}x_1^T\\x_2^T\\\vdots\\x_M^T\end{bmatrix}, \text{ and}$$

$$\tilde{V} = \underline{V}\begin{bmatrix}x_1^T\\x_2^T\\\vdots\\x_M^T\end{bmatrix}.$$

From equation (3), the complex gain of the concatenated transmit path and feedback path can be estimated as $\hat{\alpha} = R_{yx} \cdot R_{xx}^{-1}$.

The EVM is the amount of power in the measured feedback signal that is not due to the input signal being scaled by the concatenated transmit path and feedback path. In other words, the EVM is the power in the feedback signal minus the amount of power that is explained by the power of the input signal being scaled by the complex gain of the concatenated transmit path and feedback path. Thus, the EVM can be represented by the error matrix:

$$R_\perp \Sigma_{i=1}^M (\hat{y}(i)-y(i))(\hat{y}(i)-y(i))^T \quad (4)$$

where $\hat{y}(i) = \hat{\alpha}x(i)$, represents a predicted feedback signal sample based on the estimated complex gain of the concatenated transmit path and feedback path.

Figure 3:
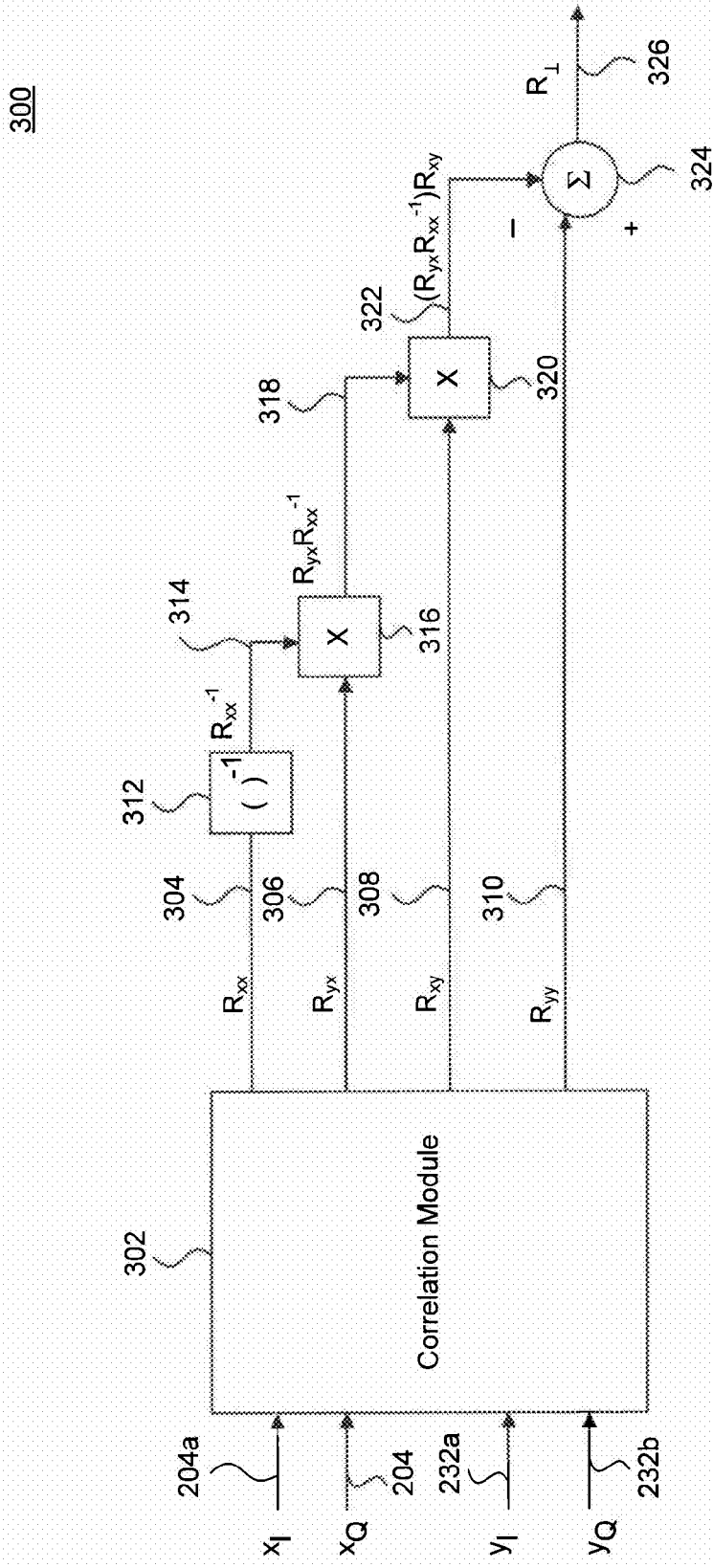
FIG. 3 illustrates an example system according to an embodiment of the present invention.

Equation (4) can be re-written as:

$$R_\perp = R_{yy} - (R_{yx} \cdot R_{xx}^{-1})R_{xy} = R_{yy} - \hat{\alpha}R_{xy} \quad (5)$$

where $R_{yy} = \Sigma_{i=1}^{N_{samples}} y(i) y^T(i) \in \mathbb{R}^2$,

FIG. 3 illustrates an example system 300 according to an embodiment of the present invention. Example system 300 may be used to perform embodiments of the present invention, such as generating estimates of the complex gain a of the concatenated transmit path and feedback path of the RF transmitter and of the EVM at the output of the PA.

As shown in FIG. 3, example system 300 includes a correlation module 302, a matrix inverter module 312, a first multiplier 316, a second multiplier 320, and a subtractor 324. Example system 300 may be integrated in its entirety within TX statistics calculator module 216. Alternatively, a portion of example system 300 may be in TX statistics calculator module 216 and another portion may be in digital module 202. For example, in an embodiment, correlation module 302 is in TX statistics calculator module 216, and the rest of the components of example system 300 are in digital module 202.

As shown in FIG. 3, example system 300 receives I and Q signals 204a and 204b (which represent the input reference signal) from digital module 202 and feedback I and Q signals 232a and 232b from the feedback path (which represent the feedback signal). In an embodiment, I and Q signals 204a and 204b are delayed appropriately to ensure timing alignment with feedback I and Q signals 232a and 232b. Feedback I and Q signals 232a and 232b result from the measurement of the forward signal components present at the PA output.

Using signals 204a-b and feedback signals 232a-b, correlation module 430 generates cross-correlation signals $R_{yx}$ 306 and $R_{xy}$ 308 and auto-correlation signals $R_{xx}$ 304 and $R_{yy}$ 310, where x represents the input reference signal and y represents the feedback signal.

Mathematically, if I and Q signals 204a-b and feedback I and Q signals 232a-b are represented, respectively, by the vectors $$x(k) = \begin{bmatrix} x_I(k) \\ x_Q(k) \end{bmatrix}$$

$\in \mathbb{R}^2$ and $$y(k) = \begin{bmatrix} y_I(k) \\ y_Q(k) \end{bmatrix}$$

$\in \mathbb{R}^2$, then cross-correlation signals 302 and 308 represent, respectively, the matrices $R_{yx} = \Sigma_{i=1}^{Nsamples} y(i) x^T(i) \in \mathbb{R}^2$ and $R_{xy} = \Sigma_{i=1}^{Nsamples} x(i) y^T(i) \in \mathbb{R}^2$, and auto-correlation signals 304 and 310 represent, respectively, the matrices $R_{xx} = \Sigma_{i=1}^{Nsamples} x(i) x^T(i) \in \mathbb{R}^2$ and $R_{yy} = \Sigma_{i=1}^{Nsamples} y(i) y^T(i) \in \mathbb{R}^2$, where $N_{samples}$ represents a predetermined number of samples over which the correlations are accumulated. In an embodiment, the predetermined number of samples is the equivalent of sampling one or more symbols.

Signal $R_{xx}$ 304 is input into matrix inverter module 312 to generate signal $R_{xx}^{-1}$ 314. Signal $R_{xx}^{-1}$ 314 is then multiplied, using first multiplier 316, with signal $R_{yx}$ 306, to generate a signal $(R_{yx} R_{xx}^{-1})$ 318. Signal $(R_{yx} R_{xx}^{-1})$ 318 represents an estimate of the complex gain α of the concatenated transmit path and feedback path.

Signal $(R_{yx} R_{xx}^{-1})$ 318 is then multiplied, using second multiplier 320, with signal $R_{xy}$ 308 to generate a signal $(R_{yx} R_{xx}^{-1}) R_{xy}$ 322. Finally, signal $(R_{yx} R_{xx}^{-1}) R_{xy}$ 322 is subtracted, using subtractor 324, from signal $R_{yy}$ 310, to generate a signal $R_\perp$ 326. Signal $R_\perp$ 326 provides a direct measure of the EVM composite of the transmit path and the feedback path. In an embodiment, the EVM contribution of the feedback path is much lower (e.g., 20 dB lower) than the EVM contribution of the transmit path. Accordingly, signal $R_\perp$ 326 estimates the EVM of the transmit path to within +/−1 dB accuracy.

Figure 4:
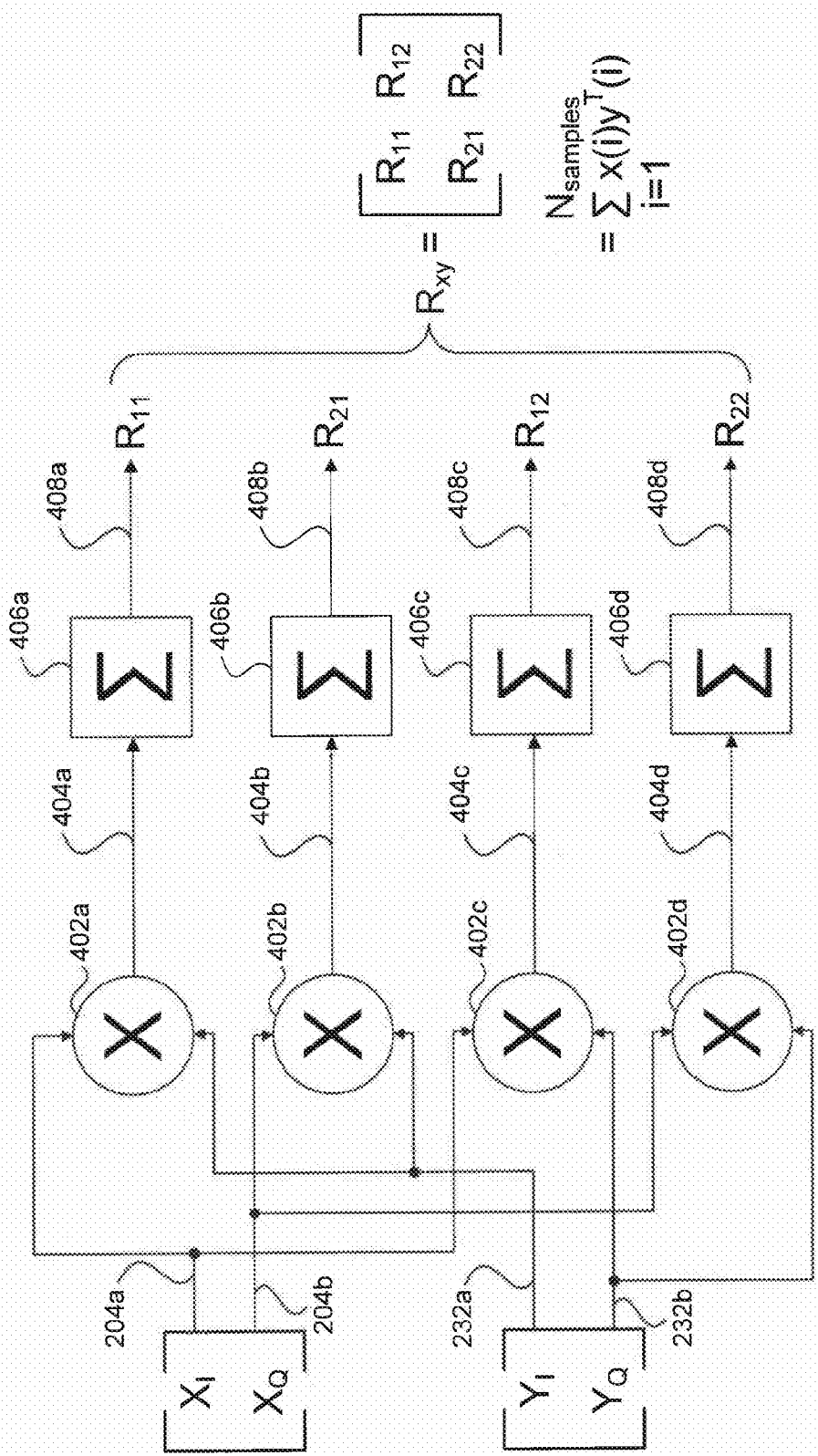
FIG. 4 illustrates an example correlation module according to an embodiment of the present invention.

FIG. 4 illustrates an example correlation module 400 according to an embodiment of the present invention. As shown in FIG. 4, correlation module 400 includes a plurality of multipliers 402a-d and a plurality of accumulators 406a-d.

Example correlation module 400 may be an embodiment of correlation module 302 shown in FIG. 3. As such, correlation module 400 receives I and Q signals 204a and 204b (which represent the digital input reference signal) from digital module 202 and feedback I and Q signals 232a and 232b from the feedback path (which represent the digital feedback signal). In an embodiment, I and Q signals 204a and 204b are delayed appropriately to ensure timing alignment with feedback I and Q signals 232a and 232b. Feedback I and Q signals 232a and 232b may result from the measurement of the forward signal components present at the PA output.

As shown in FIG. 4, correlation module 400 cross-correlates I and Q signals 204a and 204b with feedback I and Q signals 232a and 232b using multipliers 402a-d, to generate multiplication products 404a-d. Multiplication products 404a-d are then accumulated using accumulators 406a-d for a predetermined duration (e.g., for the duration of one or two symbols) to generate accumulator outputs 408a-d. As shown in FIG. 4, accumulator outputs 408a-d represent elements $R_{11}$, $R_{12}$, $R_{21}$, and $R_{22}$ of a cross-correlation matrix $R_{xy}$, where x represents the input reference signal and y represents the feedback signal.

As discussed above with reference to FIG. 3, correlation module 400 may also be used to produce a cross-correlation matrix $R_{yx}$. In an embodiment, $R_{yx}$ is generated by swapping signals 204a and 204b and signals 232a and 232b at the inputs of correlation module 400. Correlation module 400 may also be used to produce auto-correlation matrices $R_{xx}$ of the input reference signal and $R_{yy}$ of the feedback signal. To generate $R_{xx}$, feedback I and Q signals 232a and 232b are replaced, respectively, with I and Q input signals 204a and 204b at the input of correlation module 400. To generate $R_{yy}$, I and Q input signals 204a and 204b are replaced, respectively, with feedback I and Q signals 232a and 232b at the input of correlation module 400.

Figure 5:
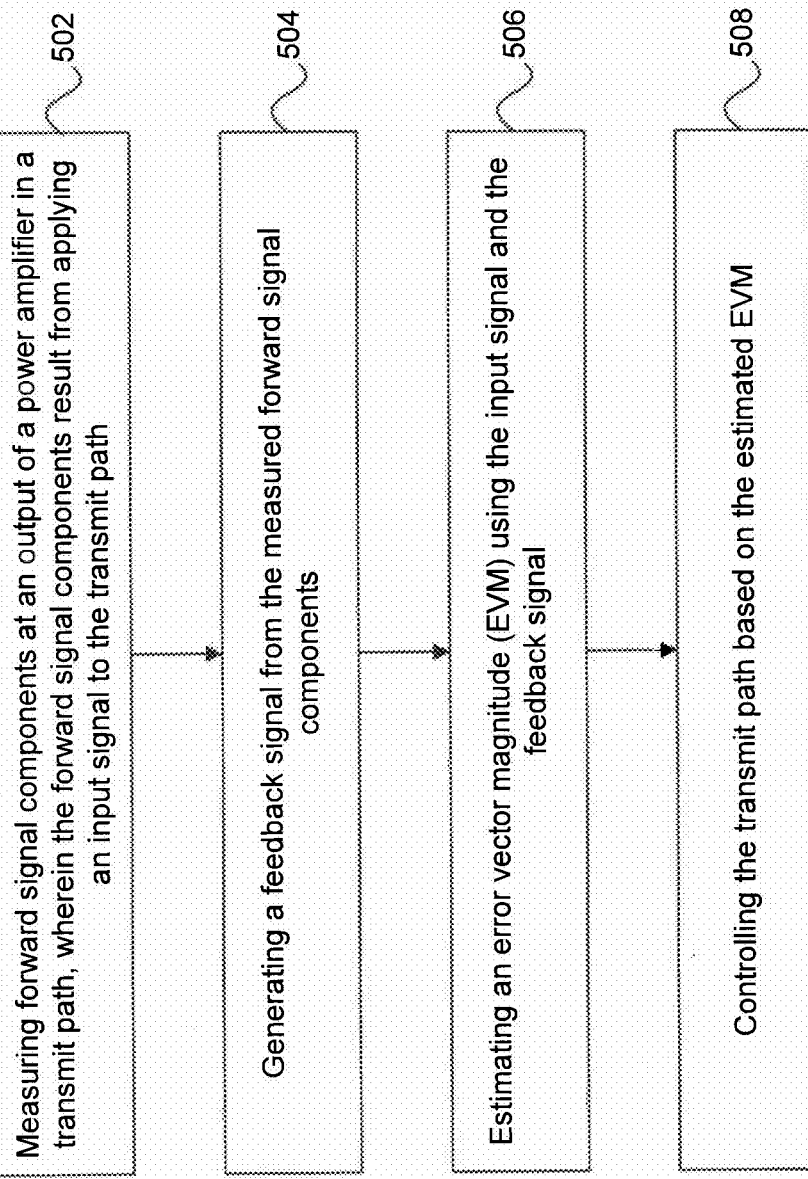
FIG. 5 is a process flowchart of a method for controlling a transmit path of a wireless device according to an embodiment of the present invention.

FIG. 5 is a process flowchart 500 of a method for controlling a transmit path, including a power amplifier (PA), of a wireless device.

As shown in FIG. 5, process 500 begins in step 502, which includes measuring forward signal components at an output of the PA. The forward signal components result from applying an input signal to the transmit path of the wireless device. The input signal may be generated by a digital module, coupled to the transmit path. In an embodiment, step 502 is performed by a directional coupler coupled to the output of the PA.

Process 500 continues at step 504, which includes generating a feedback signal from the measured forward signal components. In an embodiment, generating the feedback signal includes generating amplitude and phase information from the measured forward signal components by down-converting and digitizing the forward signal components to generate forward digital baseband in-phase (I) and quadrature (Q) signals.

Process 500 then proceeds to step 506, which includes estimating an error vector magnitude (EVM) using the input signal and the feedback signal. The EVM represents a measure of distortion of the transmit path. In an embodiment, estimating the EVM includes estimating a complex gain of a concatenated transmit path and feedback path of the wireless device, using the input signal and the feedback signal; and estimating the EVM based on a difference between the feedback signal and a scaled version of the input signal, which is scaled by the estimated complex gain.

In an embodiment, estimating the complex gain of the concatenated path includes generating a cross-correlation product between the input signal and the feedback signal; generating an auto-correlation product of the input signal; and generating the complex gain as a ratio of the cross-correlation product to the auto-correlation product.

Process 500 terminates at step 508, which includes controlling the transmit path based on the estimated EVM. In an embodiment, step 508 further includes controlling the transmit path based on a comparison of the estimated EVM to a desired EVM. The desired EVM is specified by an air interface specification with which the wireless device complies (e.g., WiMAX RCT, 3GPP TS 36.101, etc.).

In an embodiment, step 508 further includes controlling a supply voltage of the PA based on the comparison of the estimated EVM to the desired EVM. For example, the supply voltage of the PA may be increased the estimated EVM is higher than the desired EVM, or reduced when the estimated EVM is lower than the desired EVM by more than a desired margin (or more than a desired margin plus a predefined threshold).

Alternatively, or additionally, step 508 may include reducing an output power at the output of the PA when the estimated EVM is higher than the desired EVM. In an embodiment, the output power is reduced by controlling one or more of a bias current of a PA driver circuit (located before the PA) and an amplitude of the input signal (generated by the digital module) to reduce the output power at the output of the PA.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method for controlling a transmit path, including a power amplifier (PA), of a wireless device, comprising:
   measuring forward signal components at an output of the PA, wherein the forward signal components result from applying an input signal to the transmit path of the wireless device;
   generating a feedback signal from the measured forward signal components using a feedback path of the wireless device, wherein generating the feedback signal includes generating amplitude and phase information from the measured forward signal components;
   estimating an error vector magnitude (EVM) using the input signal and the feedback signal; and
   controlling the transmit path based on the estimated EVM, wherein controlling the transmit path comprises controlling a supply voltage of the PA based on a comparison of the estimated EVM to a desired EVM, and wherein controlling the supply voltage comprises increasing the supply voltage of the PA when the estimated EVM is higher than the desired EVM.

2. The method of claim 1, wherein generating the amplitude and phase information from the measured forward signal components comprises down-converting and digitizing the forward signal components to generate forward digital baseband in-phase (I) and quadrature (Q) signals.

3. The method of claim 1, wherein estimating the EVM comprises:
   estimating a complex gain of a concatenated path consisting of the transmit path and the feedback path of the wireless device using the input signal and the feedback signal; and
   estimating the EVM based on a difference between the feedback signal and a scaled version of the input signal, wherein the scaled version of the input signal is scaled by the estimated complex gain.

4. The method of claim 3, wherein estimating the complex gain of the concatenated path comprises:
   generating a cross-correlation product between the input signal and the feedback signal;
   generating an auto-correlation product of the input signal; and
   generating the complex gain as a ratio of the cross-correlation product to the auto-correlation product.

5. The method of claim 1, wherein controlling the transmit path based on the estimated EVM comprises:
   controlling an output power at the output of the PA based on the comparison of the estimated EVM to a desired EVM.

6. The method of claim 1, wherein the desired EVM is specified by an air interface specification with which the wireless device complies.

7. The method of claim 1, further comprising:
   reducing the supply voltage of the PA when the estimated EVM is lower than the desired EVM by more than a desired margin.

8. The method of claim 5, further comprising:
   reducing the output power at the output of the PA when the estimated EVM is higher than the desired EVM.

9. The method of claim 8, further comprising:
   controlling one or more of: a bias current of a PA driver circuit and an amplitude of the input signal to reduce the output power at the output of the PA.

10. A wireless device, comprising:
    a digital module configured to generate an input signal;
    a transmit path, comprising:
        a filtering and up-conversion module configured to generate a radio frequency (RF) signal from the input signal; and
        a power amplifier (PA) configured to power amplify the RF signal to generate an output waveform; and
    a feedback path, comprising:
        a directional coupler configured to receive forward signal components at an output of the PA, wherein the forward signal components result from applying the input signal to the transmit path; and
        an RF receiver configured to generate a feedback signal from the forward signal components by generating amplitude and phase information from the forward signal components;
    wherein the digital module is further configured to estimate an error vector magnitude (EVM, using the input signal and the feedback signal, control a supply voltage of the PA based on a comparison of the estimated EVM to a desired EVM, and increase the supply voltage of the PA when the estimated EVM is higher that the desired EVM.

11. The wireless device of claim 10, wherein the digital module is further configured to estimate a complex gain of a concatenated path consisting of the transmit path and the feedback path using the input signal and the feedback signal; and to estimate the EVM based on a difference between the feedback signal and a scaled version of the input signal, wherein the scaled version of the input signal is scaled by the estimated complex gain.

12. The wireless device of claim 10, wherein the digital module is further configured to control an output power of the waveform based on the comparison of the estimated EVM to a desired EVM.

13. The wireless device of claim 10, wherein the desired EVM is specified by an air interface specification with which the wireless device complies.

14. The wireless device of claim 10, wherein the digital module is further configured to reduce the supply voltage of the PA when the estimated EVM is lower than the desired EVM by more than a desired margin.

15. The wireless device of claim 12, wherein the digital module is further configured to reduce an output power of the output waveform when the estimated EVM is higher than the desired EVM.

16. The wireless device of claim 15, wherein the transmit path includes a PA driver circuit located before the PA, and wherein the digital module is configured to control one or more of a bias current of the PA driver circuit and an amplitude of the input signal generated by the digital module to reduce the output power of the output waveform.

17. The wireless device of claim 11, wherein the digital module is further configured to:
generate a cross-correlation product between the input signal and the feedback signal;
generate an auto-correlation product of the input signal; and
generate the complex gain as a ratio of the cross-correlation product of the auto-correlation product.

18. A wireless device, comprising:
a power amplifier (PA);
a coupler coupled to an output of the PA;
means for measuring an output of the coupler to estimate an error vector magnitude (EVM); and
means for controlling the PA based on the measured output of the coupler, wherein the means for controlling the PA further comprises means for controlling a supply voltage of the PA based on a comparison of the estimated EVM to a desired EVM, and wherein the means for controlling the supply voltage of the PA comprises means for increasing the supply voltage of the PA when the estimated EVM is higher than the desired EVM.

19. The wireless device of claim 18, wherein the means for measuring the output of the coupler includes means for estimating the EVM based on the output of the coupler.

20. The wireless device of claim 18, wherein the means for controlling further includes at least one of:
means for adjusting a gain setting of the PA; and
means for adjusting a bias setting of the PA.

21. The wireless device of claim 18, wherein the means for controlling the supply voltage of the PA includes an envelope tracking power supply.

22. The wireless device of claim 18, wherein the means for controlling the supply voltage of the PA includes a switching mode power supply (SMPS).

23. The wireless device of claim 19, wherein the means for estimating the EVM comprises:
means for estimating a complex gain of a concatenated path consisting of a transmit path and a feedback path of the wireless device; and
means for estimating the EVM based on a difference between the output of the coupler and a scaled version of an input signal, the scaled version of the input signal being scaled by the estimated complex gain.

* * * * *

UNITED STATES PATENT AND TRADEMARK OFFICE
CERTIFICATE OF CORRECTION

PATENT NO. : 8,837,635 B2  
APPLICATION NO. : 13/491167  
DATED : September 16, 2014  
INVENTOR(S) : Lorenz et al.

Page 1 of 1

It is certified that error appears in the above-identified patent and that said Letters Patent is hereby corrected as shown below:

IN THE CLAIMS:

Column 10, line 57, please replace "(EVM," with --(EVM)--.

Column 11, line 22, please replace "more of a bias" with --more of: a bias--.

Column 11, line 32, please replace "product of the auto-correlation product" with --product to the auto-correlation product--.

Signed and Sealed this  
Twenty-seventh Day of January, 2015

Michelle K. Lee  
*Deputy Director of the United States Patent and Trademark Office*